United States Patent [19]
Adams

[11] 3,940,243
[45] Feb. 24, 1976

[54] SEMICONDUCTOR WAFER BAKING AND HANDLING SYSTEM

[75] Inventor: Anthony L. Adams, Richardson, Tex.

[73] Assignee: Texas Instruments Incorporated, Dallas, Tex.

[22] Filed: Sept. 9, 1974

[21] Appl. No.: 504,580

[52] U.S. Cl. ................ 432/144; 302/2 R; 432/124
[51] Int. Cl.² .......................................... F27B 9/00
[58] Field of Search ............ 432/144, 124, 122, 121; 302/2

[56] References Cited
UNITED STATES PATENTS

| | | | |
|---|---|---|---|
| 542,338 | 7/1895 | Huey | 432/121 |
| 2,237,659 | 4/1941 | Edwards | 432/122 |
| 3,771,948 | 11/1973 | Matsumiya | 432/122 |

Primary Examiner—John J. Camby
Attorney, Agent, or Firm—Harold Levine; James T. Comfort; James O. Dixon

[57] ABSTRACT

A semiconductor wafer baking and handling system includes a pair of wheel assemblies each comprising a pair of spaced apart plates having opposed, aligned slots formed therein for receiving and supporting semiconductor wafers. A wafer transporting air track includes portions extending between the plates of both of the wheel assemblies. The wheel assemblies are rotated about axes lying substantially in the plane of and extending perpendicularly to the path of wafer travel along the air track to sequentially position the slots to receive semiconductor wafers, to rotate the received semiconductor wafers through an arc of 180°, and to subsequently sequentially position the slots to effect removal of the semiconductor wafers. One of the wheel assemblies is mounted in a housing which also encloses a heater, a fan, and baffles for directing gas from the fan across the heater and across the wafers to effect baking of the wafers. The other wheel assembly is maintained at room temperature and functions as a temporary storage and inverting apparatus for the wafers.

16 Claims, 7 Drawing Figures

SEMICONDUCTOR WAFER BAKING AND HANDLING SYSTEM

This invention relates to a semiconductor wafer baking and handling system, and more particularly to a semiconductor wafer baking and handling system which functions to bake semiconductor wafers for a predetermined wafer baking time of relatively long duration while maintaining the wafer throughput rate of an associated electronic component processing system.

In the fabrication of electronic components and devices, semiconductor materials are first manufactured in polycrystalline form, and are then grown into a single crystal. Typically, the single crystal takes the form of a cylindrical billet which is subsequently sawed into wafers. By way of example, such a semiconductor wafer may have a diameter of approximately 3 inches and may have a thickness of approximately 20 mils (0.020 inches).

The semiconductor wafers thus formed are further processed in order to form electronic components thereon. A typical step in such processing involves the application of a photoresist material to at least one side of each wafer. The semiconductor wafers are then baked at a relatively low temperature to dry the photoresist material, after which the photoresist material is exposed to light through a mask.

The exposure to light of portions of the photoresist material results in at least partial cross-linking of the material. The wafers are thereafter subjected to a developer solution which removes the portions of the photoresist material which were not exposed to light. In certain manufacturing operations, the wafers are subsequently baked at a higher temperature to complete the cross-linking of the photoresist material. Further processing of the semiconductor wafers may include such steps as etching of the semiconductor wafers, in which case the photoresist material remaining on the semiconductor wafer protects the portion of the wafer covered thereby from contact by the etch solution.

In the past, it has been the practice to process semiconductor wafers by means of batch processing. In accordance with such procedures, a plurality of wafers are grouped into a batch, and all of the various steps comprising the particular electronic component fabrication process are applied to all of the semiconductor wafers comprising the batch substantially simultaneously. Considered another way, in accordance with the concept of batch processing, the completion of each particular step of the electronic component fabrication process is completed with respect to all of the semiconductor wafers comprising a particular batch prior to the application of the next step in the process to any of the wafers in the batch.

In accordance with more recent developments in the electronic component industry, it is now possible to process semiconductor wafers sequentially, rather than by means of batch processing. In a sequential processing system, a plurality of work stations are arranged along a predetermined path of semiconductor wafer travel. Semiconductor wafers are transported in sequence along the path by a suitable conveying device, for example, an air track. As each wafer arrives at a particular work station, the portion of the overall electronic component fabrication process associated with the work station is applied to the wafer on an individual basis. When all of the operations to be performed on the wafer at the particular work station have been completed, the wafer is returned to the conveying device and is transported thereby to the next work station.

Electronic component fabrication processes of the sequential type may be characterized by an average wafer processing time per work station. At the present, an average wafer processing time per work station of approximately 15 seconds is considered feasible in the electronic components manufacturing industry. This presents a problem with respect to the portions of such processes in which the wafers are baked, since the baking operation typically requires a considerably longer period of time. For example, a baking time of as long as 10 minutes or more may be required in the case of 3 inch diameter semiconductor wafers. Thus, a need exists for a semiconductor wafer baking and handling system which can subject the semiconductor wafers to elevated temperatures for the duration of the necessary wafer baking time, but which does not interfere with the overall semiconductor wafer throughput rate of the associated electronic component fabrication system.

The present invention comprises a semiconductor wafer baking and handling system which fulfills the foregoing and other requirements long since found lacking in the prior art. In accordance with the broader aspects of the invention, there is provided a semiconductor wafer baking zone in which a predetermined elevated temperature is maintained. Apparatus is provided for receiving individual semiconductor wafers from the air track or other wafer conveying apparatus, and for transporting the wafers through the wafer baking zone. The speed of operation of the wafer receiving the transporting apparatus is such that each semiconductor wafer remains in the baking zone for the predetermined baking time, after which the receiving and transporting apparatus returns the individual wafer to the conveying apparatus. The receiving and transporting apparatus has a wafer receiving capacity which is at least as great as the wafer baking time divided by the average wafer processing time per work station of the overall electronic component fabrication process, so that even though the semiconductor wafer baking and handling system retains each wafer for a substantial period of time, the overall semiconductor wafer throughput rate of the electronic component fabrication process is maintained.

In accordance with more specific aspects of the invention, the semiconductor wafer receiving and transporting apparatus comprises a wheel assembly including a pair of spaced apart plates having opposed, aligned slots formed therein for receiving the semiconductor wafers. The wheel assembly is mounted for rotation about an axis lying substantially in the plane of and extending perpendicularly to the path of wafer travel. The air track or other wafer conveying apparatus extends between the plates of the wheel assembly on both sides of the axis rotation. Structure is provided for rotating the wheel assembly to sequentially align the slots with the path of wafer travel to receive individual wafers from the conveying apparatus, to rotate the wafers through an arc of about 180°, and to subsequently sequentially align the slots with the path of wafer travel, whereby the wafers are returned to the conveying apparatus.

The wheel assembly is positioned within a housing which defines the wafer baking zone. A heater is provided, together with a fan for directing gas across the heater and across the semiconductor wafers in the wheel assembly to effect baking of the wafers. More specifically, the heater may comprise a circular heater mounted concentrically with the wheel assembly and the fan may comprise a centrifugal fan mounted within the heater assembly, in which case baffles are provided for directing gas from the fan outwardly across the heater, then axially to the wheel assembly, then inwardly past the semiconductor wafers in the wheel assembly, and then back into the fan. Apparatus may also be provided for maintaining a predetermined atmosphere, such as an atmosphere rich in nitrogen gas, within the baking zone.

In accordance with still more specific aspects of the invention, the semiconductor wafer baking and handling system comprises two wheel assemblies positioned at spaced apart points along the path of wafer travel. The first wheel assembly is mounted within the housing and is utilized in the baking of the semiconductor wafers. It will be understood that upon discharge from the first wheel assembly, the wafers are in an inverted orientation with respect to the path of wafer travel. The second wheel assembly functions to re-invert the wafers, that is, to return each wafer to its original orientation with respect to the path. The second wheel assembly also functions as a temporary storage apparatus for the semiconductor wafers.

A more complete understanding of the invention may be had by reference to the following detailed description, when taken in conjunction with the accompanying drawings, wherein.

Figure 1:
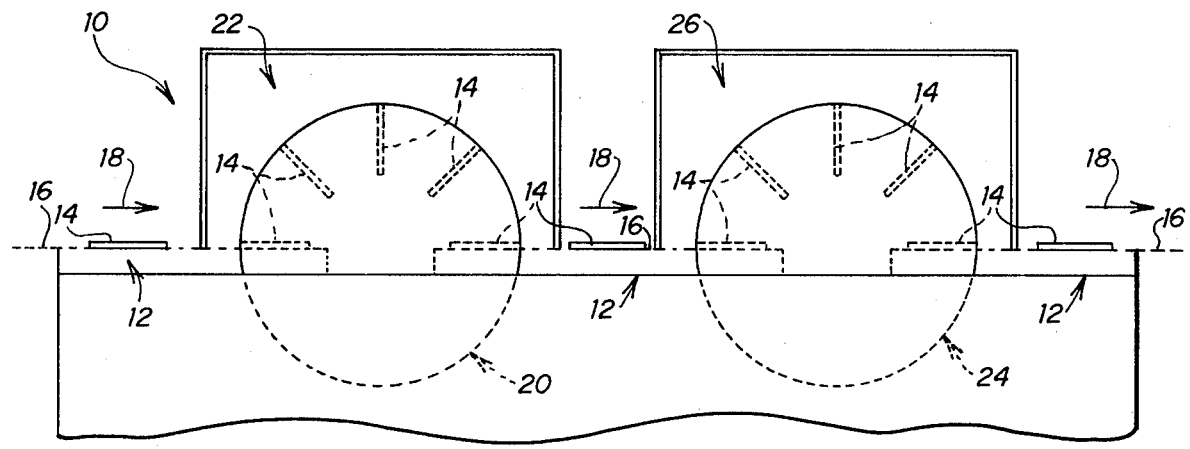
FIG. 1 is a schematic illustration of a semiconductor wafer baking and handling system incorporating the invention.

Referring now to the drawings, and particularly to FIG. 1 thereof, a semiconductor wafer baking and handling system 10 incorporating the present invention is schematically illustrated. The system 10 includes an air track 12 or other suitable conveying apparatus for transporting semiconductor wafers 14 along a predetermined path of wafer travel 16. The semiconductor wafers 14 travel along the path 16 generally in the direction indicated by the arrows 18. A wafer receiving and transporting apparatus 20 is provided for receiving individual wafers traveling along the path 16 under the action of the air track 12 and for transporting the wafers through a wafer baking zone 22. A predetermined elevated temperature is maintained within the baking zone 22, and the wafer receiving and transporting apparatus 20 is operated at a predetermined rate such that each wafer 14 remains in the baking zone 22 for a predetermined wafer baking time. The wafer receiving and transporting apparatus 20 then realigns the wafers 14 with the path 16, whereupon the air track 12 transports the wafers out of the apparatus 20 and along the path 16 in the direction of the arrows 18.

As will be appreciated from the drawings, the wafer receiving and transporting apparatus 20 rotates each wafer 14 through an arc of 180° during the transportation thereof through the baking zone 22. The wafers 14 leaving the apparatus 20 are thus inverted relative to their normal orientation with respect to the path 16. It is also considered desirable to provide a certain amount of storage capacity in the semiconductor wafer baking and handling system 10. Therefore, wafers 14 leaving the wafer receiving and transporting apparatus 20 and traveling along the path 16 under the action of the air track 12 are individually received by a second wafer receiving and transporting apparatus 24. The wafer receiving and transporting apparatus 24 transports the wafers 14 through an inversion zone 26 which differs from the baking zone 22 in that it is maintained at room temperature. The apparatus 24 then realigns the individual wafers 14 with the path 16. The air track 12 then removes the wafer from the apparatus 24 and moves the wafer 14 along the path 16 in the direction of the arrows 18.

The semiconductor wafer baking and handling system 10 is utilized as a component of an electronic component fabrication system. Such a system has a plurality of work stations disposed along the path of wafer travel, and may be characterized by an average wafer processing time per station. For example, such an average wafer processing time per work station may be approximaterial 15 seconds. On the other hand, the wafer baking time, that is, the time period during which each wafer must remain in the baking zone, is usually considerably longer than the average wafer processing time per work station. For example, a typical wafer baking time for a 3 inch diameter wafer might be 10 minutes or longer.

In order to permit each wafer to remain in the baking zone for the required baking time while maintaining the wafer throughput rate of the overall electronic component fabrication system, it is necessary for the wafer receiving and transporting apparatus of the semiconductor baking and handling system to have a wafer capacity which is at least equal to the wafer baking time divided by the average wafer processing time per work station. For example, if the average wafer processing time per work station is 15 seconds and the wafer baking time is 10 minutes, each wafer receiving and transporting apparatus of the semiconductor wafer baking and handling system must have a wafer capacity of at least 40 wafers. When the type of wafer receiving and transporting apparatus shown in FIG. 1 is used, each apparatus must have a capacity of at least 80 wafers because only half of the wafer receiving and transporting capacity thereof is available for use at any one time.

Figure 4:
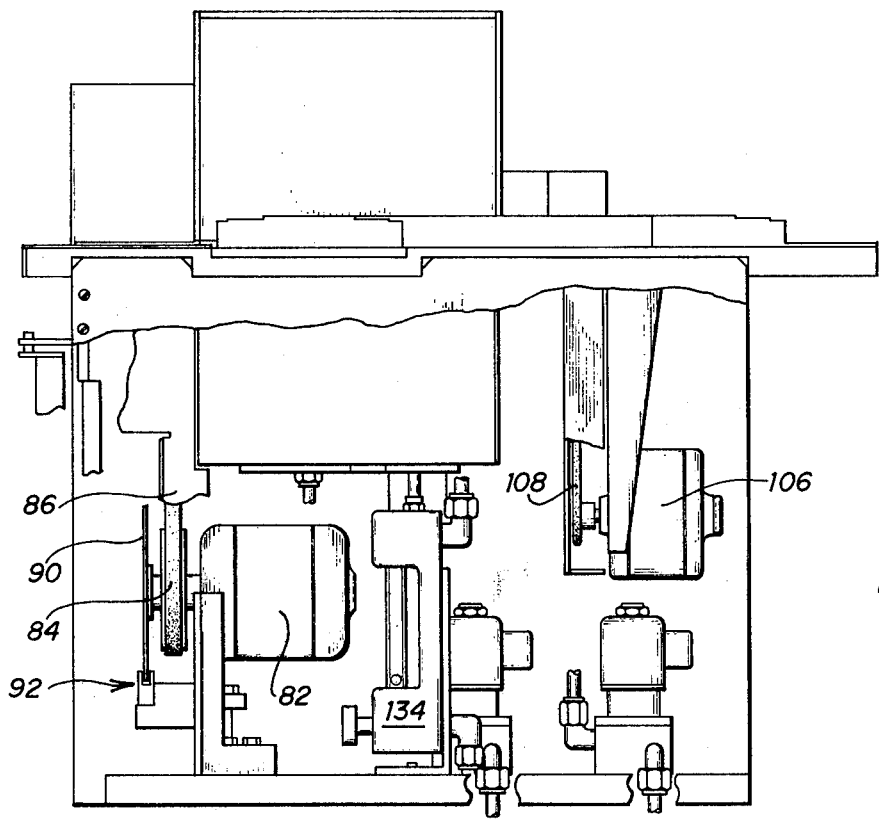
FIG. 4 is an end view of the system in which certain parts have been broken away.
Figure 2:
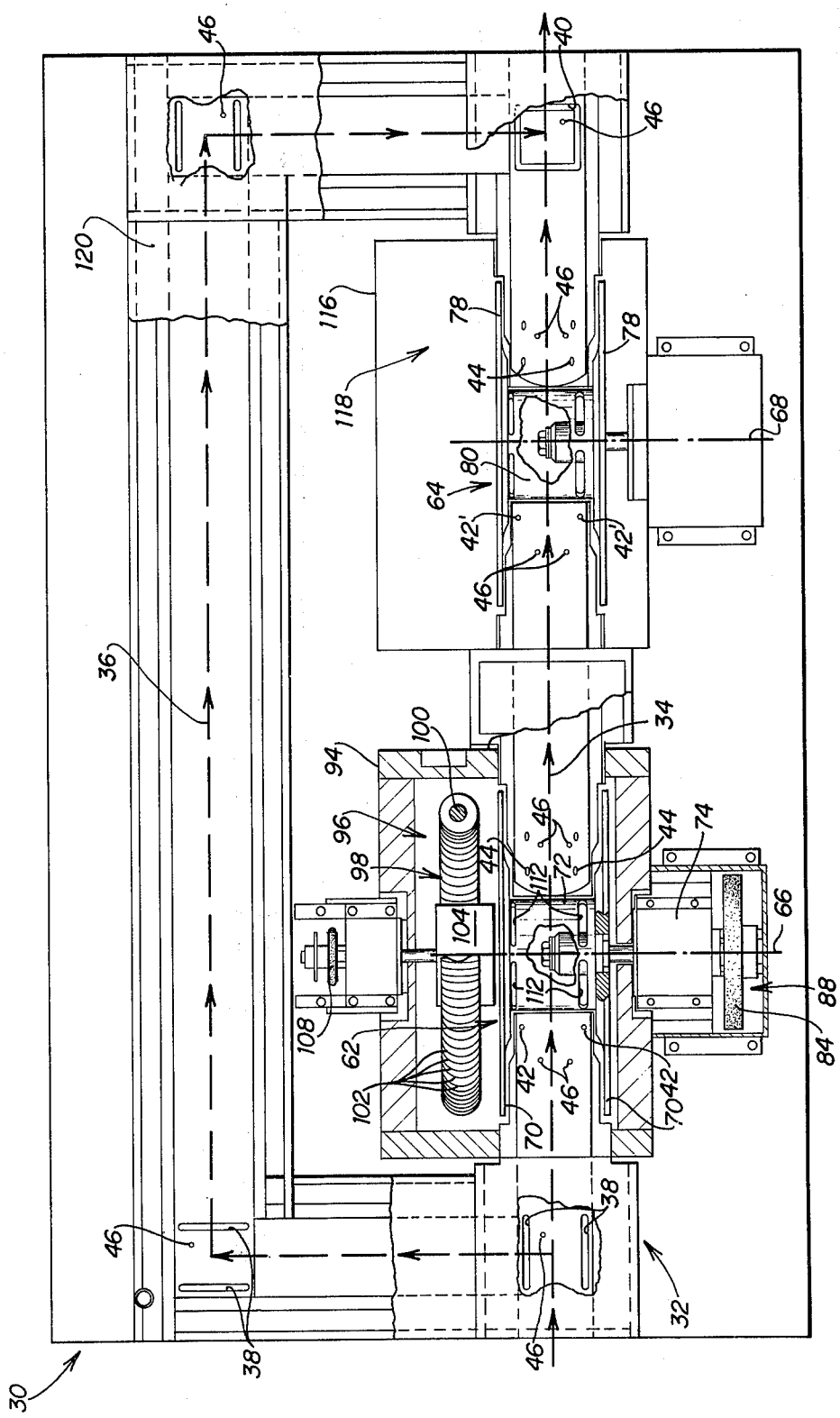
FIG. 2 is a top view of a semiconductor wafer baking and handling system incorporating the invention in which certain parts have been broken away more clearly to illustrate certain features of the invention.
Figure 3:
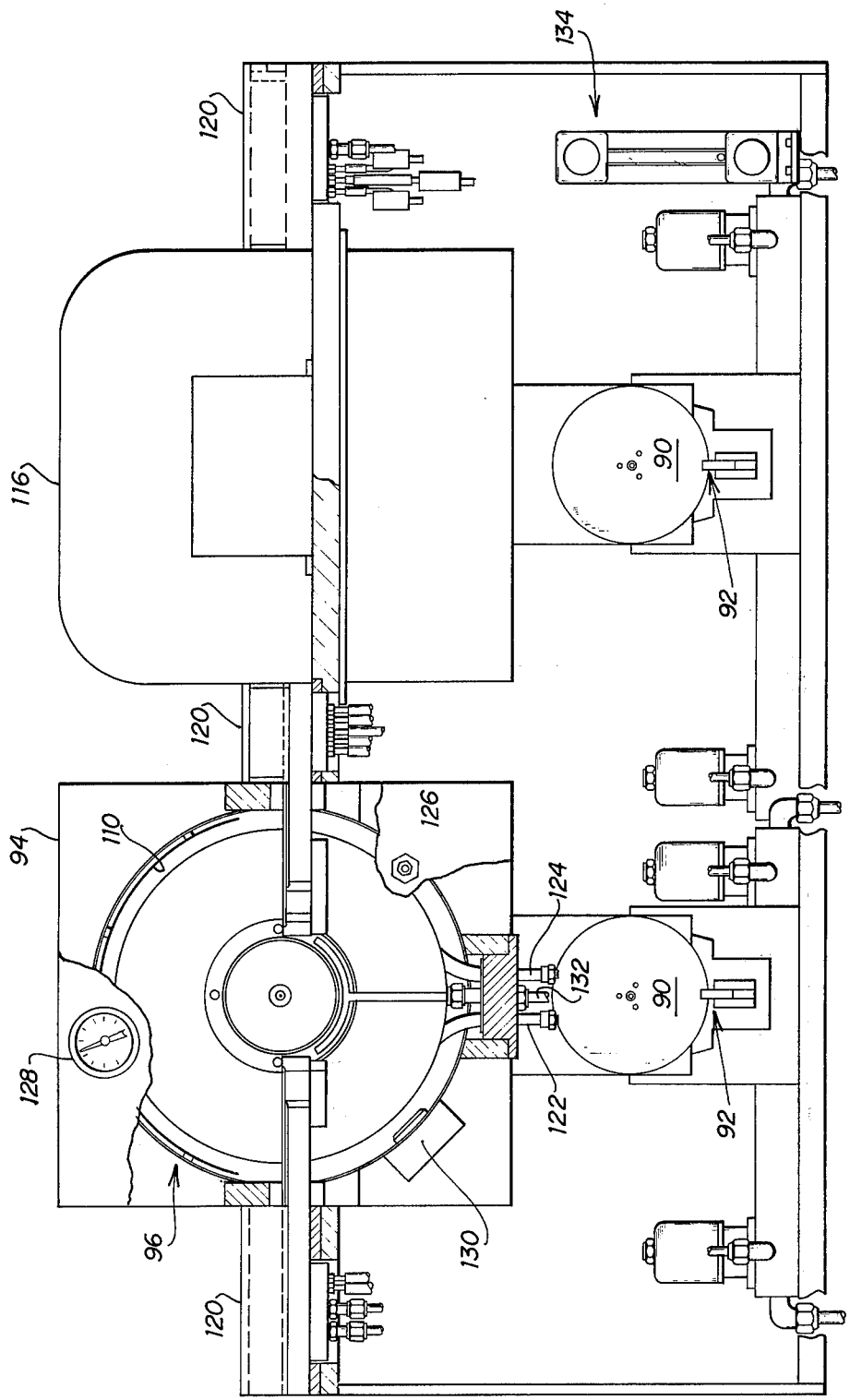
FIG. 3 is a front view of the system of FIG. 2 in which certain parts have been broken away.

Referring now to FIGS. 2, 3 and 4, there is shown a semiconductor wafer baking and handling system 30 incorporating the present invention. The system 30 includes an air track 32 having a normal path 34 and a divert path 36. The function of the divert path 36 is to permit selected semiconductor wafers to bypass the semiconductor baking and handling system of the present invention.

The air track 32 includes a plurality of slot vacuum brakes 38 and a square vacuum brake 40, all of which function to selectively arrest the movement of semiconductor wafers traveling along either the normal path or the divert path 36. The air track 32 further employs a plurality of circular vacuum brakes 42 and air brakes 42' which function to arrest semiconductor wafer movement at particular points in accordance with the operation of the semiconductor wafer baking and handling system. High pressure air jets 44 are employed in the air track 32 to dislodge any semiconductor wafers which may tend to stick in the semiconductor wafer baking and handling apparatus 30. Finally, the air track 32 is provided with a plurality of sensors 46, the function of which is to provide an output indicative of the positioning of semiconductor wafers with respect to the air track. In those instances in which dual sensors 46 are employed at adjacent positions along the normal path 34 of the air track 32, sensor redundancy in the system is deemed necessary in view of the fact that a sensor failure at such points might result in the destruction of one or more semiconductor wafers.

Figure 7:
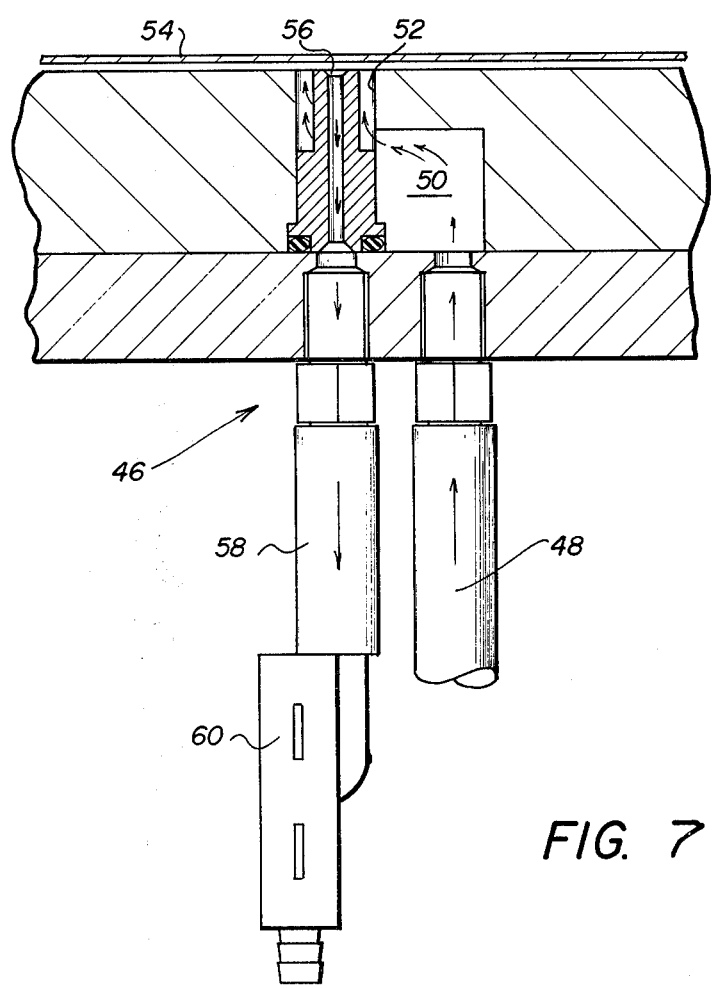
FIG. 7 is an illustration of the sensors used in the semiconductor wafer baking and handling system.

The operation of the sensors 46 of the air track 32 may be better understood by reference to FIG. 7. Pressurized air is received from a supply thereof (not shown) through a passageway 48 and is directed through a plenum 50 and out through an annular outlet aperture 52. If no wafer is present over the aperture 52, the air flowing therethrough is exhausted. However, if a semiconductor wafer 54 is positioned over the aperture 52, air flowing therethrough is diverted downwardly into a circular inlet aperture 56 and through a passageway 58 to a sensor 60. The sensor 60 therefore produces an output signal indicative of whether or not a wafer is positioned over the aperture 52. By this means it is possible to control the movement of semiconductor wafers through the semiconductor wafer baking and handling system 30, and in fact, sensors of the type illustrated in FIG. 7 make it possible to provide computer control over the processing of individual semiconductor wafers as they travel through an entire electronic component manufacturing system.

Referring again to FIG. 2, the semiconductor wafer baking and handling system 30 includes a pair of wheel assemblies 62 and 64. The wheel assemblies 62 and 64 are positioned at spaced points along the normal path 34 of the air track 32 and are mounted for rotation about spaced, parallel axes 66 and 68. The axes 66 and 68 each lie substantially in the plane of and extend substantially perpendicularly to the path of semiconductor wafer travel through the semiconductor baking and handling system 30.

The wheel assembly 62 comprises a pair of spaced apart plates 70 having opposed, aligned slots formed therein to receive individual semiconductor wafers. The plates 70 are mounted on the slotted hub 72 which is in turn supported for rotation about the axis 66 by a bearing assembly 74. The wheel assembly 64 comprises a pair of similar plates 78 mounted on a hub 80 which is not slotted. The hub 80 is supported by a bearing assembly similar to the bearing assembly 74 for rotation about the axis 68.

As is best shown in FIG. 4, the wheel assemblies 62 and 64 are driven by individual stepping motors 82 which are drivingly connected to their respective wheel assemblies by means of a toothed belt 84, a lower toothed pulley 86 and an upper toothed pulley 88 (FIG. 2). Thus, upon each actuation of the stepping motor 82, the wheel assembly associated therewith is rotated about its respective axis of rotation to sequentially align the wafer receiving slots with the air track 32, whereby a wafer may be received in the slot from the air track. Simultaneously, the wheel assembly aligns a diametrically opposed set of slots with the opposite portion of the air track, whereby a wafer may be removed from the slot of the wheel assembly by means of the high pressure jets 44 and the normal action of the air track 32.

Referring again to FIG. 4, a code wheel 90 is mounted for rotation with each of the stepping motors 82. Each code wheel 90 operates in conjunction with a light emitting device/light responsive device assembly 92 to generate an output indicative of the rotational positioning of its associated wheel assembly. This information, together with the information provided by the sensors 46 provides for complete control over the travel of semiconductor wafers through the semiconductor baking and handling system 30.

Returning again to FIG. 2, the wheel assembly 62 is mounted within an insulated housing 94 defining a semiconductor wafer baking zone 96. The heating zone 96 has a heater 98 contained therein. The heater 98 comprises a central heating element 100 having a multiplicity of fins 102 mounted thereon. A centrifugal fan 104 (sometimes referred to as a squirrel cage blower) is mounted within the heater 98. As is best shown in FIG. 4, the centrifugal fan 104 is driven by a fan motor 106 and is drivingly connected thereto by means of a belt 108 and suitable pulleys.

Figure 6:
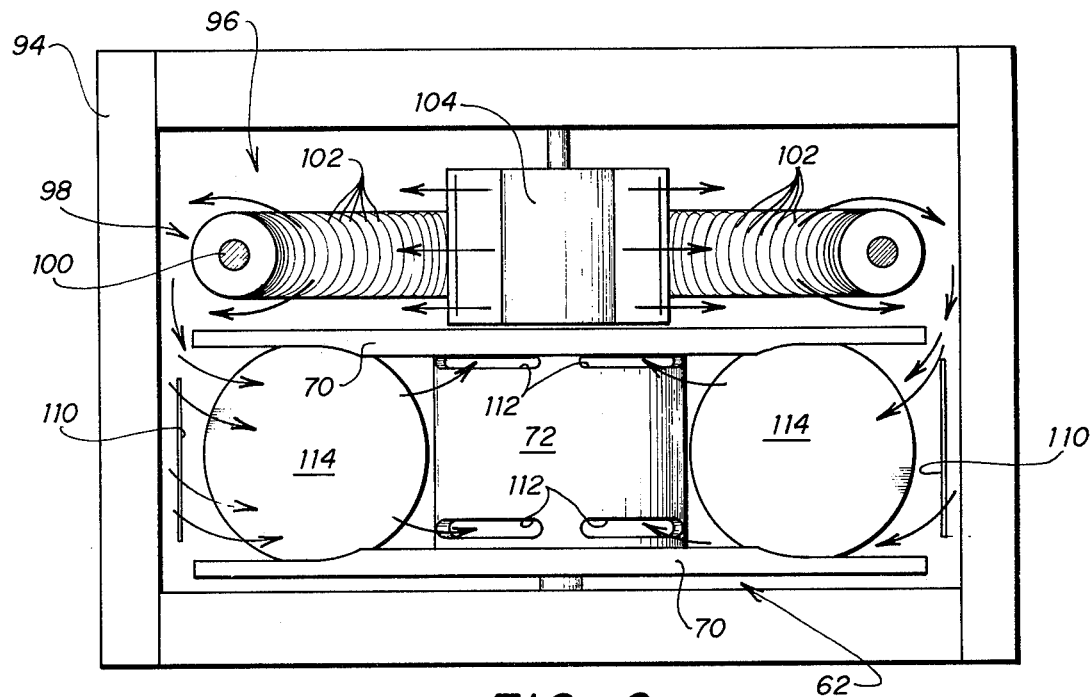
FIG. 6 is a schematic illustration of the gas flow pattern of the semiconductor wafer baking and handling system.

Referring simultaneously to FIGS. 2, 3 and 6, the housing 94 has an arcuately shaped baffle 110 mounted therein. The hub 72 of the wheel assembly 62 is provided with a plurality of slots 112. By this means the centrifugal fan 104 causes gas flow in the direction indicated by the arrows in FIG. 6, that is, first radially outwardly across the heater 98, then axially under the baffle 110, then radially inwardly across the semiconductor wafers 114 carried by the wheel assembly 62, then through the slots 112 formed in the hub 72, and back into the centrifugal fan 104. It will thus be understood that the arrangement of the component parts within the baking zone 96 effects a substantially toroidialy shaped flow of heated gas, whereby the semiconductor wafers carried by the wheel assembly 62 are heated by such gas flow during substantially the entire time that they are within the baking zone 96.

Referring again to FIG. 2, the wheel assembly 64 is enclosed by a housing 116 defining a wafer inversion zone 118 which is maintained at room temperature. The housing 116 is formed from a transparent plastic material that is specially colored in order to prevent damage to the photoresist layer on the semiconductor wafers passing through the semiconductor baking and handling system 30 under the action of ambient light. Referring both to FIGS. 2 and 3, the entire air track 32, including both the normal path 34 and the divert path 36 is enclosed in a transparent plastic housing 120 which is also specially colored in order to prevent damage to the photoresist coating on the semiconductor wafers under the action of ambient light.

FIG. 3 further illustrates certain features of the semiconductor baking and handling system 30. The heating element 100 of the heater 98 extends to a pair of terminals 122 and 124 which are in turn connected to a suitable source of electric current to effect operation of the heater 98. A temperature probe 126 is utilized to provide an output indicative of the operating temperature within the baking zone 96. The operating temperature within the baking zone 96 is also indicated by a visual temperature indicator 128. A switch 130 is provided for terminating operation of the heater 98 in the event that the temperature within the baking zone 96 exceeds the predetermined upper limit. This is primarily for the purposes of safety and fire prevention.

A conduit 132 is provided for introducing a gas or a mixture of gases into the baking zone 96 and thereby maintaining a controlled atmosphere therein. For example, in certain semiconductor wafer baking operations, it is considered desirable to maintain an atmosphere of nitrogen within the baking zone 96. A flow meter 134 provides a visual indication of the rate of gas flow through the conduit 132.

Figure 5:
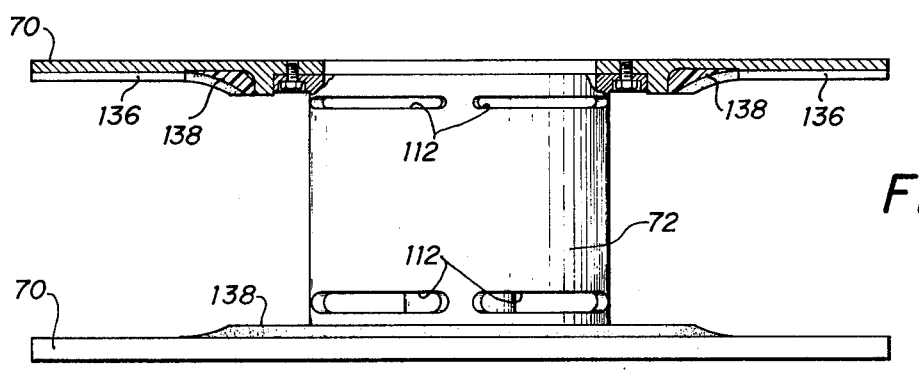
FIG. 5 is a detailed illustration of a wheel assembly utilized in the semiconductor wafer baking and handling system.

The construction of the wheel assemblies 62 and 64 of the semiconductor wafer baking and handling system 30 will be better understood by reference to FIG. 5. In particular, the plates 70 and 78 of the wheel assemblies 62 and 64, respectively, are provided with aligned, opposed slots 136. The slots 136 of the plates 70 and 78 are specially designed to receive and support semiconductor wafers without damage thereto as the wafers are rotated through the baking zone 96 and the inversion zone 118 of the semiconductor wafer baking and handling system. The slots 136 are arranged in the plates in diametrically aligned pairs. The innermost portions of the slots 136 comprise inserts 138 formed from a low function, heat resistant material such as polytetrafluoroethylene.

Operation

The stepping motors 82 function to sequentially position the slots 136 of the plates 70 comprising the wheel assembly 62 in alignment with the portion of the air track 32 extending between the plates 70 on the left-hand side (FIG. 2) of the wheel assembly 62. Upon the arrival of a semiconductor wafer in the semiconductor wafer baking and handling system 30, a decision is reached by an associated computer as to whether the particular wafer is to be directed along the normal path 34 or along the divert path 36 of the air track 32. Assuming that the wafer is to be directed along the normal path 34, the wafer is advanced by the air track 32 until its presence is detected by the sensors 46 in the portion of the air track 32 extending into the left-hand side (FIG. 2) of the wheel assembly 62. The adjacent circular vacuum brakes 42 are then applied to arrest the motion of the semiconductor wafer. At this point the wafer is positioned in one of the aligned, opposed sets of slots 136 in the plate 70.

The stepping motor 82 associated with the wheel assembly 62 is then advanced to position the next set of aligned, opposed slots 136 in the plates 70 to receive a semiconductor wafer carried by the air track 32. As this action continues, the received wafer is rotated through the baking zone, and through an arc of 180°. The operation of the stepping motor 82 is such that the received wafer is maintained in the baking zone for a predetermined wafer baking time, for example, 10 minutes. During this time the heater 98 is operated to maintain a predetermined temperature within the baking zone 96.

When the stepping motor 82 associated with the wheel assembly 62 has been operated to rotate the received wafer through an arc of 180°, its presence is detected by the sensors 46 in the portion of the air track 32 extending into the righthand side (FIG. 2) of the wheel assembly 62. The high pressure jets 44 are then actuated to dislodge the wafer from the slots 136 of the plate 70. The use of the high pressure jets 44 is necessary in this regard because the layer of photoresist material on the semiconductor wafers may cause the wafers to tend to stick in the slots 136.

At this point the received wafer is inverted with respect to its normal orientation relative to the air track 32. The air track 32 is therefore operated to continuously float the received wafer over the adjacent surface, thereby preventing any possible damage to the wafer and the layer of photoresist material thereon. The air track 32 also advances the wafer toward the wheel assembly 64.

The stepping motor 82 associated with the wheel assembly 64 also functions to sequentially align the slots 136 of the plate 78 to receive semiconductor wafers. The received wafer therefore moves along the portion of the air track 32 extending into the left-hand side (FIG. 2) of the wheel assembly 64 until its presence is detected by the sensors 46 therein. At this point the circular air brakes 42 are actuated to arrest the movement of the semiconductor wafer. This is accomplished by lifting the wafer upwardly into engagement with the wafer receiving slots of the wheel assembly 64, as opposed to drawing the wafer downwardly by vacuum action which might cause damage to the wafer.

At this point the received wafer is positioned in a pair of aligned, opposed slots 136 of the plates 78 of the wheel assembly 64. Therefore, upon subsequent actuation of the stepping motor 82 associated with the wheel assembly 64, the received wafer is rotated through an arc of 180°. Upon the completion of this rotation, the presence of the received wafer is detected by the sensors 46 in the portion of the air track extending into the right-hand side (FIG. 2) of the wheel assembly 64. The high pressure jets 44 are then actuated to advance the received wafer out of the slots 136 of the plate 78, whereupon the air track 32 advances the wafer out of the semiconductor wafer baking and handling system 30.

It will be understood that although the operation of the semiconductor wafer baking and handling system 30 has been described in conjunction with a single received semiconuctor wafer, in the actual use of the system, semicondutor wafers are received by and are discharged from the system on a substantially continuous basis. One of the primary advantages to the use of the present invention involves the fact that although individual semiconductor wafers remain in the baking zone for an extended period of time, the system is compatible with electronic component fabrication systems in which the average wafer processing time per work station is relatively short. This is because the wheel assemblies 62 and 64 of the system 30 each have a wafer receiving capacity which is at least as great as the wafer baking time divided by the average wafer processing time per work station of the overall system.

In the use of the present invention as part of a continuously operating electric component fabrication system, the wheel assembly 62 normally has a total of 40 wafers contained therein, and the wheel assembly 64 normally has a single wafer contained therein. In the event of a malfunction of the system downstream from the location of the semiconductor wafer baking and handling system incorporating the present invention, it may become impossible to transport semiconductor wafers beyond the downstream intersection between the normal path 34 and the divert path 36 of the air track 32. In such instances the semiconductor wafer baking and handling system of the present invention continuously functions, with wafers from the wheel assembly 62 being accumulated in the wheel assembly 64. Simultaneously the next wafer to arrive at the baking and handling system of the present invention is retained at the upstream intersection between the normal path 34 and the divert path 36 of the air track 32. In this manner the baking of the wafers in the wheel assembly 62 is completed and the baked wafers are stored in the wheel assembly 64 until such time as further processing of the wafers is permitted.

Although particular embodiments of the invention have been illustrated in the accompanying drawings and described in the foregoing detailed description, it will be understood that the invention is not limited to the embodiments disclosed, but is capable of numerous rearrangements, modifications, and substitutions of parts and elements without departing from the spirit of the invention.

What is claimed is:

1. A semiconductor wafer handling system comprising:
   means for advancing semiconductor wafers along a predetermined path of travel including incoming and outgoing portions;
   wheel means including a plurality of radially extending slot means each for receiving and supporting a semiconductor wafer;
   means supporting the wheel means for rotation about an axis lying substantially in the plane of and extending substantially perpendicularly to the predetermined path of semiconductor wafer travel;
   means for rotating the wheel means about the axis to sequentially align the slot means with the incoming portion of the path of semiconductor wafer travel so that the semiconductor wafers are received in the slot means from the incoming portion of the path, to rotate received semiconductor wafers through a predetermined arc, and to subsequently sequentially align each slot means with the outgoing portion of the path of semiconductor wafer travel so that semiconductor wafers are removed from the slot means for travel along the outgoing portion of the path.

2. The semiconductor wafer handling system according to claim 1 wherein:
   the wheel means comprises a pair of spaced apart plates;
   the slot means of the wheel means comprises sets of aligned, opposed slots formed in the plates; and
   the incoming and outgoing portions of the path of semiconductor wafer travel extend between the plates of the wheel means.

3. The semiconductor wafer handling system according to claim 1 wherein the semiconductor wafer advancing means comprises air track means.

4. The semiconductor wafer handling system according to claim 1 wherein the means for rotating the wheel means about the axis comprises means for rotating the wheel means to sequentially position the slot means in alignment with the incoming portion of the path of semiconductor wafer travel and to subsequently sequentially position diametrically opposed slot means in alignment with the outgoing portion of the path of semiconductor travel.

5. The semiconductor wafer handling system according to claim 4 wherein the means for rotating the wheel means includes a stepping motor for rotating the wheel means step by step about the axis.

6. The semiconductor wafer handling system according to claim 1 further including means for directing a heated gas over the semiconductor wafers in the slot means during the rotation thereof through the predetermined arc and thereby baking the semiconductor wafers.

7. A semiconductor wafer baking system comprising:
   means for advancing semiconductor wafers along a predetermined path of travel including incoming and outgoing portions;
   wheel means including a plurality of radially extending slot means each for receiving and supporting a semiconductor wafer;
   means supporting the wheel means for rotation about an axis lying substantially in the plane of and extending substantially perpendicularly to the predetermined path of semiconductor wafer travel;
   means for rotating the wheel means about the axis to sequentially align the slot means with the incoming portion of the path of semiconductor wafer travel so that semiconductor wafers are received in the slot means from the incoming portion of the path, to rotate received semiconductor wafers through a predetermined arc, and to subsequently sequentially align each slot means with the outgoing portion of the path of semiconductor wafer travel so that the semiconductor wafers are removed from the slot means for travel along the outgoing portion of the path; and
   means for directing a heated fluid over the semiconductor wafers during the rotation thereof through the predetermined arc and thereby baking the semiconductor wafers.

8. The semiconductor wafer baking system according to claim 7 wherein the means for directing a heated fluid over the wafers further comprises:
   a housing surrounding the wheel means;
   means for directing a predetermined gas into the housing;
   heater means mounted within the housing for heating the gas therein; and
   fan means mounted within the housing for directing the heated gas over the semiconductor wafers in the slot means of the wheel means.

9. The semiconductor wafer baking system according to claim 8 wherein:
   the heater means is circular in shape and substantially concentric with the wheel means;
   the fan means comprises a centrifugal fan mounted for rotation within the heater means; and
   the housing includes baffle means for directing heated gas from the fan means across the heater means and the semiconductor wafers in the wheel means and then returning the gas to the fan.

10. The semiconductor wafer baking system according to claim 7 wherein the wheel means comprises a pair of spaced apart plates, wherein the slot means each comprise a pair of aligned slots formed in the two plates of the wheel means, and wherein the incoming and outgoing portions of the predetermined path of travel each extend between the plates of the wheel means.

11. The semiconductor wafer baking system according to claim 7 wherein the semiconductor wafer advancing means comprises air track means.

12. A semiconductor wafer baking and handling system comprising:

a pair of wheel assemblies positioned at spaced points along a predetermined path of wafer travel and each comprising a pair of spaced apart plates having aligned, opposed slots formed therein for receiving and supporting individual semiconductor wafers;

means supporting the wheel assemblies for rotation about spaced apart axes lying in the plane of and extending perpendicularly to the path of wafer travel;

air track means extending along the path of wafer travel for sequentially advancing semiconductor wafers therealong and including portions extending between the plates of both of the wheel assemblies on both sides of the axes of rotation; and means for rotating the wheel assemblies about the axes to sequentially align the slots of the wheel assemblies with the air track means so that semiconductor wafers are received therefrom in the slots, to rotate the received semiconductor wafers through predetermined arcs, and to subsequently align each of the slots with the air track means to effect removal of the semiconductor wafers from the slots.

13. The semiconductor wafer baking and handling system according to claim 12 wherein the slots of each wheel assembly are arranged in diametrically opposed sets and wherein the wheel assembly rotating means rotates the wheel assemblies in step by step fashion to sequentially align the slots with the air track means to receive semiconductor wafers therefrom and to simultaneously align the slots with the air track means to effect removal of the semiconductor wafers therefrom.

14. The semiconductor wafer baking and handling system according to claim 12 further characterized by:
housing means enclosing one of the wheel assemblies and defining a semiconductor wafer baking zone;
heater means;
fans means; and
means for directing gas from the fan means across the heater means and across the semiconductor wafers in the wheel assembly to effect baking thereof during the rotation of the semiconductor wafers through the predetermined arc by the wheel assembly.

15. The semiconductor wafer baking and handling system according to claim 14 further including means for maintaining a predetermined atmosphere within the housing means during the baking of the semiconductor wafers therein.

16. The semiconductor wafer baking and handling system according to claim 14 wherein the heater means comprises a circular heater configuration which is substantially concentric with the wheel assembly, wherein the fan means comprises a centrifugal fan mounted within the heater means, and wherein the gas flow directing means comprises baffle means mounted within the housing for directing gas flow from the fan means first radially outwardly across the heater means, then axially across the semiconductor wafer in the wheel assembly, then inwardly between the plates of the wheel assembly, and then into the fan means.

* * * * *